United States Patent
Dangler et al.

(10) Patent No.: US 7,492,985 B2
(45) Date of Patent: Feb. 17, 2009

(54) FLEXIBLE PRINTED CIRCUITS CAPABLE OF TRANSMITTING ELECTRICAL AND OPTICAL SIGNALS

(75) Inventors: John R. Dangler, Rochester, MN (US); Matthew S. Doyle, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/166,442

(22) Filed: Jul. 2, 2008

(65) Prior Publication Data

US 2008/0267556 A1   Oct. 30, 2008

Related U.S. Application Data

(63) Continuation of application No. 11/383,985, filed on May 18, 2006.

(51) Int. Cl.
*G02B 6/12* (2006.01)

(52) U.S. Cl. ............... 385/14; 385/101; 385/131

(58) Field of Classification Search ............ 385/14, 385/100, 101, 129–132, 134, 147
See application file for complete search history.

(56) References Cited

U.S. PATENT DOCUMENTS

2005/0094922 A1 * 5/2005 Ha et al. ............. 385/14

* cited by examiner

*Primary Examiner*—Kevin S Wood
(74) *Attorney, Agent, or Firm*—Dillon & Yudell LLP

(57) ABSTRACT

A flexible printed circuit capable of transmitting electrical and optical signals is disclosed. The flexible printed circuit includes a set of optical waveguides for transmitting optical signals and a set of conductors for transmitting electrical signals. Each of a subset of the optical waveguides is enclosed by a respectively one of the conductors. The optical waveguide is made of glass or plastic. The conductors are formed within a first building block constructed by a first dielectric layer and a first substrate layer, and a second building block constructed by a second dielectric layer and a second substrate layer.

10 Claims, 3 Drawing Sheets

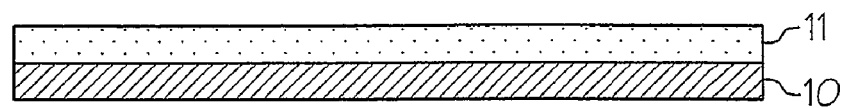
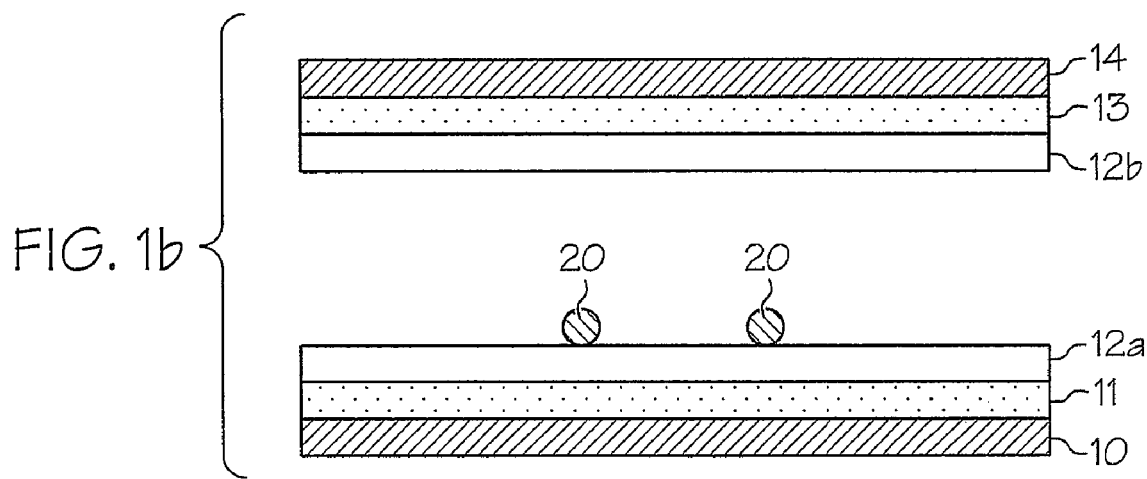
FIG. 1a
FIG. 1b
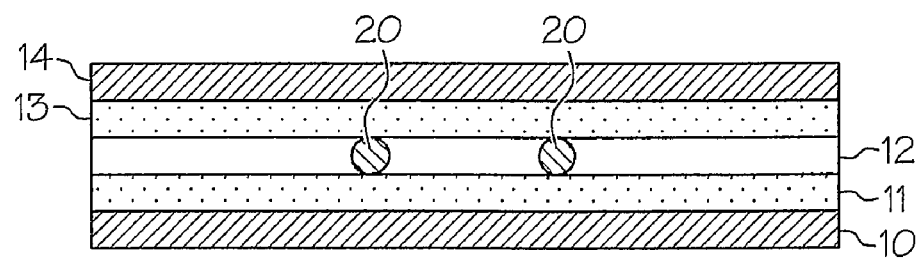
FIG. 1c

FLEXIBLE PRINTED CIRCUITS CAPABLE OF TRANSMITTING ELECTRICAL AND OPTICAL SIGNALS

PRIORITY CLAIM

The present application is a continuation of U.S. patent application Ser. No. 11/383,985, filed on May 18, 2006, and entitled, "Flexible Printed Circuits Capable of Transmitting Electrical and Optical Signals," which is incorporated herein by reference.

BACKGROUND OF THE INVENTION

1. Technical Field

The present invention relates to print circuits in general. More particularly, the present invention relates to flexible printed circuits. Still more particularly, the present invention relates to a method for manufacturing a flexible printed circuit capable of transmitting electrical and optical signals.

2. Description of Related Art

Printed circuit boards are commonly used to interconnect electronic components to each other. A multilayer printed circuit board typically includes several layers of copper traces embedded within an epoxy board. The copper traces are designed and lay out to provide proper electrical connections for various electronic components mounted on the multilayer printed circuit board. Electronic components can be mounted on a multilayer printed circuit board using solder joint or surface mount technology.

Conventional printed circuit boards are typically rigid in nature and may not be suitable for all applications. Thus, for some applications, flexible printed circuits are used to reduce packaging costs without affecting electrical performance.

As for high-speed electronic applications, optical devices are used instead of electronic components. As such, optical fibers are needed to interconnect optical devices. However, conventional printed circuit boards include only interconnects that are only capable of transmitting electrical signals.

Consequently, it would be desirable to provide an improved flexible printed circuit board that is capable of transmitting more than electrical signals.

SUMMARY OF THE INVENTION

In accordance with a preferred embodiment of the present invention, a flexible printed circuit includes a set of optical waveguides for transmitting optical signals and a set of conductors for transmitting electrical signals. Each of a subset of the optical waveguides is enclosed by a respectively one of the conductors. The optical waveguide is made of glass or plastic. The conductors are formed within a first building block constructed by a first dielectric layer and a first substrate layer, and a second building block constructed by a second dielectric layer and a second substrate layer.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIGS. 1a-1h are cross-sectional views of a method for manufacturing a flexible printed circuit capable of transmitting electrical and optical signals, in accordance with a preferred embodiment of the present invention.

DETAILED DESCRIPTION OF A PREFERRED EMBODIMENT

Figure 1D:
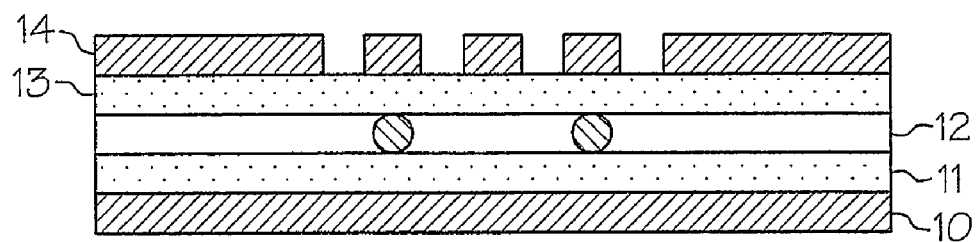

Referring now to the drawings and in particular to FIGS. 1a-1h, there are depicted cross-sectional views of a method for manufacturing a flexible printed circuit capable of transmitting electrical and optical signals, in accordance with a preferred embodiment of the present invention. Initially, a first flexible printed circuit building block is assembled. The first flexible printed circuit building block includes a substrate layer 10 and a dielectric layer 11, as shown in FIG. 1a. Substrate layer 10 is preferably made of copper, but substrate layer 10 can also be made of other types of conductive metals. Dielectric layer 11 is preferably made of polymide; however, dielectric layer 11 can be any one or a combination of polyester, teflon or glass weaves.

After an adhesive layer 12a has been placed on top of dielectric layer 11, a set of optical waveguides 20 is placed on top of adhesive layer 12a, as depicted in FIG. 1b. Optical waveguides 20 are preferably made of glass or plastic having a diameter of similar to that of their copper counterparts.

Next, a second flexible printed circuit building block, which includes a dielectric layer 13 and a substrate layer 14, is prepared by adding an adhesive layer 12b adjacent to dielectric layer 13, as depicted in FIG. 1b. Substrate layer 14 is preferably made of copper, but substrate layer 14 can also be made of other types of conductive metals. Dielectric layer 13 is preferably made of polymide; however, dielectric layer 13 can be any one or a combination of polyester, teflon or glass weaves.

The second flexible printed circuit building block is then placed on top of the first flexible printed circuit building block with adhesive layer 12a in direct contact with adhesive layer 12b. As a result, optical waveguides 20 are embedded within an adhesive layer 12 formed by the combination of adhesive layers 12a and 12b, as shown in block 1c.

Subsequently, portions of substrate layer 14 are removed using any etching method that is well-known in the relevant art, as depicted in FIG. 1d. The etching is preferably performed with an appropriate mask to allow a desired portion of substrate layer 14 to be removed. The remaining portions of substrate layer 14 provide the necessary electrical interconnects for a specific application.

Figure 1E:
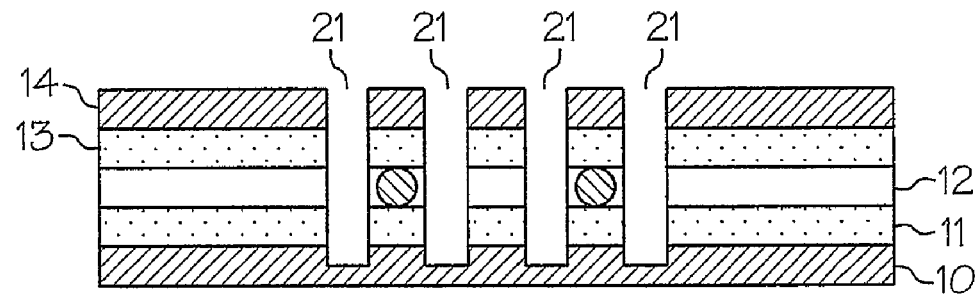
Figure 1F:
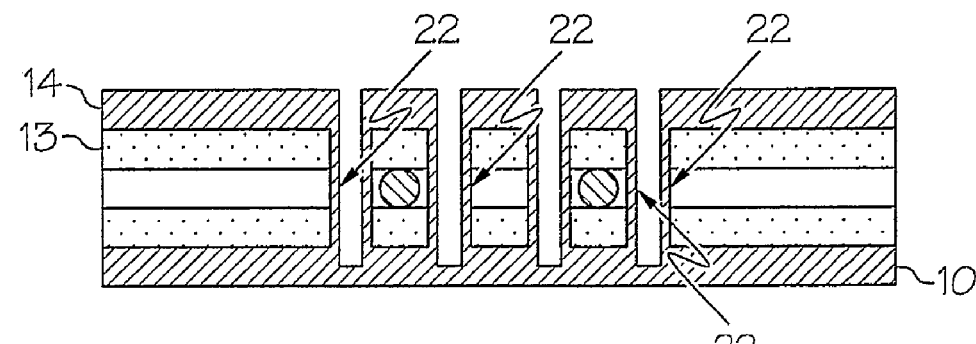

Laser ablation is then used to construct multiple channels 21 that pass through various layers, as shown in FIG. 1e. Preferably, channels 21 pass though layers 14-11 and stop within substrate layer 10 (i.e., did not pass through substrate layer 10).

Next, the walls of channels 21 are plated by metal coatings 22 via any of the well-known plating methods, such as seeding and plating, as depicted in block 1f. Metal coatings 22 are preferably made of copper, but metal coatings 22 can also be made of other types of conductive metals.

Figure 1G:
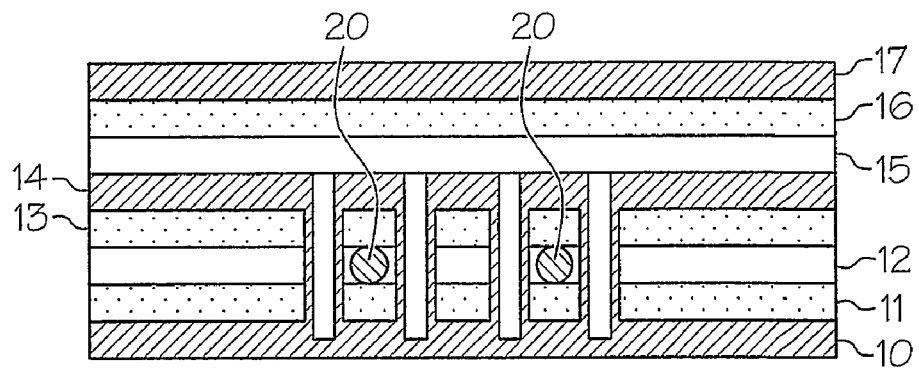

A third flexible printed circuit building block, which includes a dielectric layer 16 and a substrate layer 17, is placed on top of substrate layer 14 via an adhesive layer 15, as shown in FIG. 1g. As such, dielectric layer 16 is bound to substrate layer 14 by adhesive layer 15. Substrate layer 17 is preferably made of copper, but substrate layer 17 can also be made of other types of conductive metals. Dielectric layer 16 is preferably made of polymide; however, dielectric layer 16 can be any one or a combination of polyester, teflon or glass weaves.

Figure 1H:
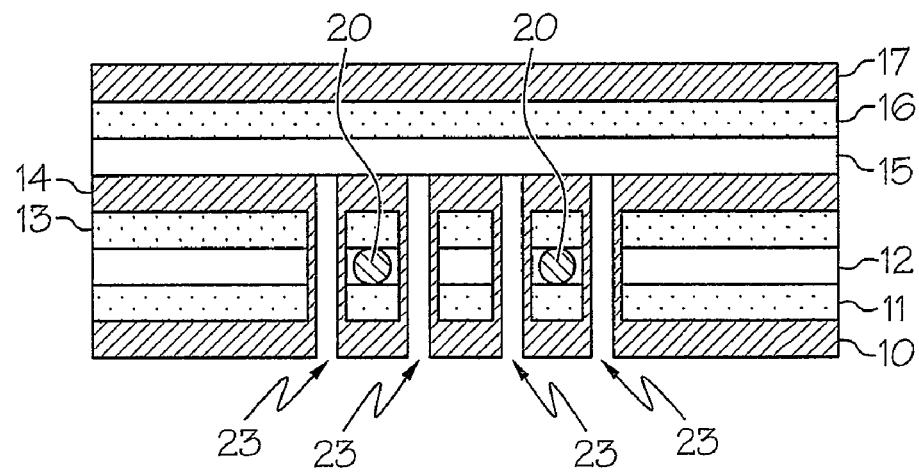

Next, substrate layer 10 is selectively etched to provide openings 23. As a result, each of waveguides 20 is enclosed by an individual conductor (i.e., substrate layer 10, substrate layer 14 and metal coatings 22), as depicted in FIG. 1h.

Figure 2:
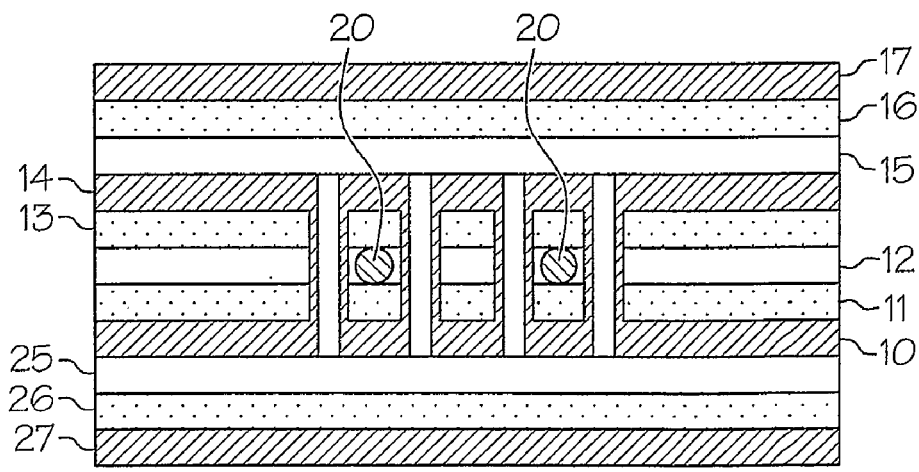
FIG. 2 is a cross-sectional view of a flexible printed circuit capable of transmitting electrical and optical signals, in accordance with a preferred embodiment of the present invention.

Finally, a fourth flexible printed circuit building block, which includes a dielectric layer 26 and a substrate layer 27, is adhered to substrate layer 10 via an adhesive layer 25, as shown in FIG. 2. Dielectric layer 26 is bound to substrate layer 10 via adhesive layer 25. Substrate layer 27 is preferably made of copper, but substrate layer 27 can also be made of other types of conductive metals. Dielectric layer 26 is preferably made of polymide; however, dielectric layer 26 can be any one or a combination of polyester, teflon or glass weaves.

In the flexible printed circuit shown in FIG. 2, optical waveguides 20 are used to transmit optical signals and conductors (i.e., substrate layer 10, substrate layer 14 and metal coatings 22) are used to transmit electrical signals.

As has been described, the present invention provides a method for manufacturing a flexible printed circuit capable of transmitting electrical and optical signals.

While the invention has been particularly shown and described with reference to a preferred embodiment, it will be understood by those skilled in the art that various changes in form and detail may be made therein without departing from the spirit and scope of the invention.

What is claimed is:

1. A flexible printed circuit comprising:
a plurality of optical waveguides for transmitting optical signals; and
a plurality of conductors for transmitting electrical signals, wherein said plurality of conductors are formed within a first building block and a second building block, said first building block includes a first dielectric layer adhered to a first substrate layer, said second building block includes a second dielectric layer adhered to a second substrate layer, wherein said first building block is bonded to said second building block via a first adhesive layer in which said plurality of optical waveguides are located, wherein some of said plurality of conductors are adapted to enclose one of said plurality of waveguides within said first adhesive layer by having said first substrate layer from said first building block connected to said second substrate layer from said second building block via metal coatings.

2. The flexible printed circuit of claim 1, wherein said optical waveguides are made of glass.

3. The flexible printed circuit of claim 1, wherein said optical waveguides are made of plastic.

4. The flexible printed circuit of claim 1, wherein said metal coatings are made of copper.

5. The flexible printed circuit of claim 1, wherein said first and second substrate layers are made of copper.

6. The flexible printed circuit of claim 1, wherein said first and second dielectric layers are selected from a group consisting of polymide, polyester, teflon and glass weaves.

7. The flexible printed circuit of claim 1, wherein said flexible printed circuit further includes a third building block and a fourth building block, said third building block includes a third dielectric layer adhered to a third substrate layer, and said fourth building block includes a fourth dielectric layer adhered to a fourth substrate layer.

8. The flexible printed circuit of claim 7, wherein said third dielectric layer of said third building block is bonded to said second substrate layer of said second building block via a second adhesive layer, and said fourth dielectric layer of said fourth building block is bonded to said first substrate layer of said first building block via a third adhesive layer.

9. The flexible printed circuit of claim 7, wherein said third and fourth substrate layers are made of copper.

10. The flexible printed circuit of claim 7, wherein said third and fourth dielectric layers are selected from a group consisting of polymide, polyester, teflon and glass weaves.

* * * * *